US011936966B2

(12) United States Patent
Ogawa

(10) Patent No.: US 11,936,966 B2
(45) Date of Patent: Mar. 19, 2024

(54) IMAGING DEVICE WITH COOLING MECHANISM

(71) Applicant: Panasonic Intellectual Property Management Co., Ltd., Osaka (JP)

(72) Inventor: Tomohiko Ogawa, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 197 days.

(21) Appl. No.: 17/580,908

(22) Filed: Jan. 21, 2022

(65) Prior Publication Data

US 2022/0240414 A1 Jul. 28, 2022

(30) Foreign Application Priority Data

Jan. 27, 2021 (JP) .................................. 2021-011319

(51) Int. Cl.
*H04N 23/52* (2023.01)
*H05K 7/20* (2006.01)

(52) U.S. Cl.
CPC ......... *H04N 23/52* (2023.01); *H05K 7/20172* (2013.01); *H05K 7/20209* (2013.01); *H05K 7/2039* (2013.01)

(58) Field of Classification Search
None
See application file for complete search history.

(56) References Cited

U.S. PATENT DOCUMENTS

| 6,078,359 | A  | * | 6/2000  | Conder     | H05K 3/4641 |
|-----------|----|---|---------|------------|-------------|
|           |    |   |         |            | 348/E5.025  |
| 6,880,346 | B1 | * | 4/2005  | Tseng      | H10N 10/13  |
|           |    |   |         |            | 257/E23.099 |
| 10,412,252| B2 | * | 9/2019  | Petty      | H04N 23/52  |
| 2004/0169771 | A1 | * | 9/2004 | Washington | H04N 23/52  |
|           |    |   |         |            | 348/E5.025  |
| 2007/0163269 | A1 | * | 7/2007 | Chung      | H01L 23/38  |
|           |    |   |         |            | 62/3.2      |
| 2015/0054961 | A1 | * | 2/2015 | Saitoh     | H04N 23/11  |
|           |    |   |         |            | 348/164     |
| 2015/0358564 | A1 | * | 12/2015| Kang       | H01L 23/36  |
|           |    |   |         |            | 348/244     |
| 2020/0194420 | A1 | * | 6/2020 | Scobee     | H01L 23/4093|
| 2021/0127477 | A1 | * | 4/2021 | Li         | G02B 7/028  |

(Continued)

FOREIGN PATENT DOCUMENTS

| JP | H08-046878 A   | 2/1996 |
|----|----------------|--------|
| JP | 2000-101888 A  | 4/2000 |

(Continued)

*Primary Examiner* — Paul M Berardesca
(74) *Attorney, Agent, or Firm* — Renner, Otto, Boisselle & Sklar, LLP

(57) ABSTRACT

An imaging device includes a heat generating source; a heat radiating plate that cools the heat generating source; a thermoelectric element that includes a heat absorbing surface in contact with the heat radiating plate and a heat radiating surface different from the heat absorbing surface, and receives supply of electric power to discharge the heat absorbed by the heat absorbing surface from the heat radiating surface; a first heat sink that is in contact with the heat radiating surface of the thermoelectric element and is spaced apart from the heat radiating plate; and a second heat sink that is in contact with the heat radiating plate.

4 Claims, 7 Drawing Sheets

(56) References Cited

U.S. PATENT DOCUMENTS

| | | | |
|---|---|---|---|
| 2021/0176386 A1* | 6/2021 | Swihart | H04N 23/52 |
| 2021/0181819 A1* | 6/2021 | Scobee | G06F 1/206 |
| 2021/0289110 A1* | 9/2021 | Ogawa | H05K 1/021 |
| 2022/0159158 A1* | 5/2022 | Smirnov | G02B 13/16 |
| 2022/0286593 A1* | 9/2022 | Amano | H04N 23/531 |

FOREIGN PATENT DOCUMENTS

| | | | | |
|---|---|---|---|---|
| JP | 2010-213000 A | | 9/2010 | |
| WO | WO-9206561 A1 | * | 4/1992 | |
| WO | WO-2015025687 A1 | * | 2/2015 | G03B 17/55 |
| WO | 2018/142555 A1 | | 8/2018 | |

* cited by examiner

IMAGING DEVICE WITH COOLING MECHANISM

BACKGROUND OF THE INVENTION

Field of the Invention

The present disclosure relates to an imaging device.

Description of the Related Art

For example, JP 2010-213000 A discloses an imaging device that cools an imaging element by a Peltier element (thermoelectric element). The heat absorbed by the Peltier element from the imaging element is transferred to a heat sink having a plurality of fins. The plurality of fins of the heat sink are cooled by the air blown from the cooling fan.

SUMMARY OF THE INVENTION

However, in the case of the imaging device described in JP 2010-213000 A, it is necessary to continue to supply electric power to the thermoelectric element while cooling the imaging element. As a result, the battery of the imaging device is consumed faster.

Therefore, it is an object of the present disclosure to cool a heat generating source such as an imaging element in an imaging device while suppressing power consumption.

In order to solve the above-mentioned problems, according to one aspect of the present disclosure, an imaging device is provided which includes:

a heat generating source;

a heat radiating plate that cools the heat generating source;

a thermoelectric element that includes a heat absorbing surface in contact with the heat radiating plate and a heat radiating surface different from the heat absorbing surface, and receives supply of electric power to discharge the heat absorbed by the heat absorbing surface from the heat radiating surface;

a first heat sink that is in contact with the heat radiating surface of the thermoelectric element and is spaced apart from the heat radiating plate; and a second heat sink that is in contact with the heat radiating plate.

According to the present disclosure, it is possible to cool a heat generating source such as an imaging element in an imaging device while suppressing power consumption.

DESCRIPTION OF THE PREFERRED EMBODIMENT

Hereinafter, a detailed description of an embodiment will be given with reference to drawings as appropriate. However, a detailed description more than necessary may be omitted in some cases. For example, a detailed description of a well-known item and a duplicate description for a substantially identical component may be omitted in some cases. This is to avoid an unnecessarily redundant description and to allow those skilled in the art to easily understand the following description.

In addition, the inventor(s) provides the accompanying drawings and the following description in order for those skilled in the art to fully understand the present disclosure, and it is not intended to limit the subject matter described in the claims by these.

Hereinafter, the imaging device according to the embodiment of the present disclosure will be described with reference to the drawings.

Figure 1:
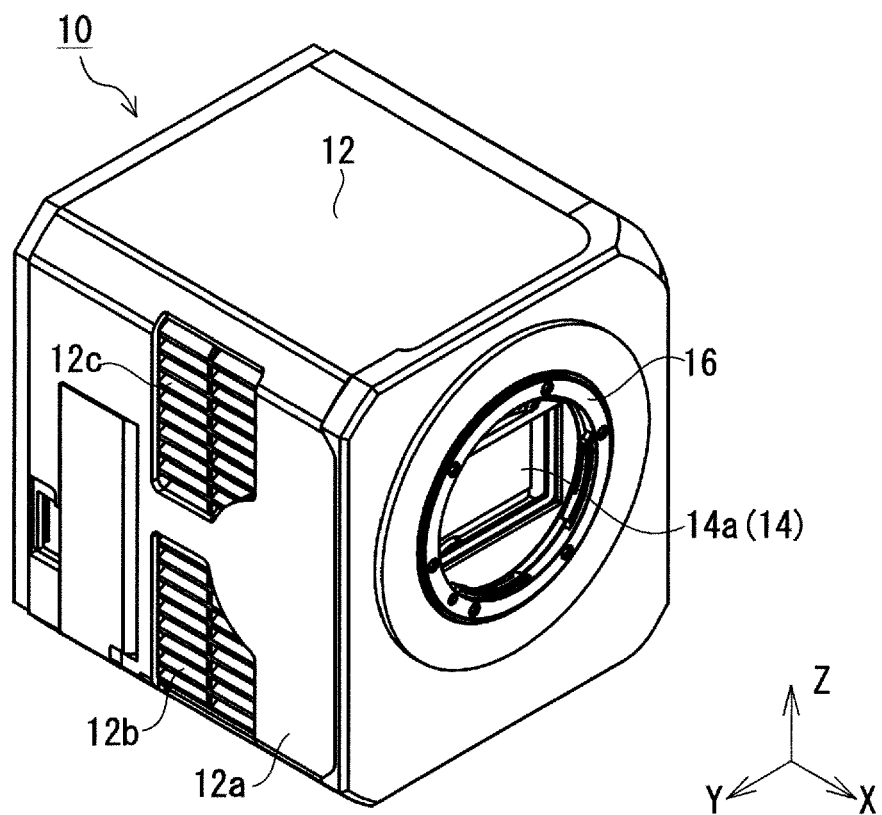
FIG. 1 is a perspective view of an imaging device according to an embodiment of the present disclosure.
Figure 2:
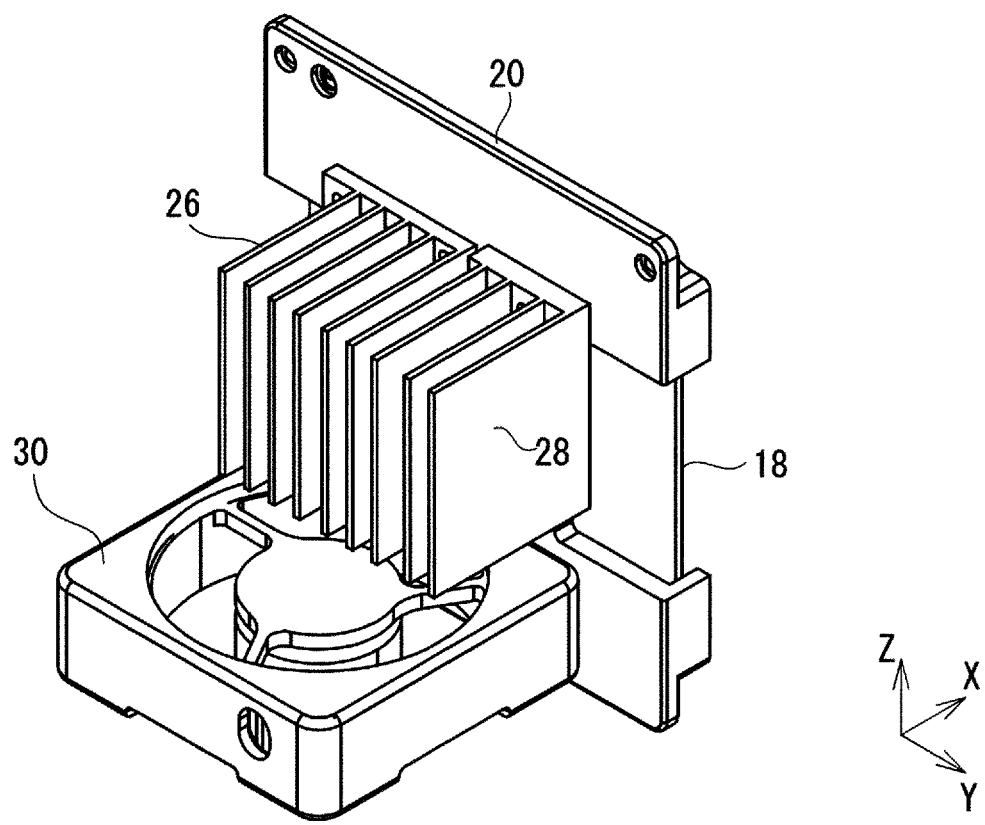
FIG. 2 is a perspective view of a cooling system of an imaging element.
Figure 3:
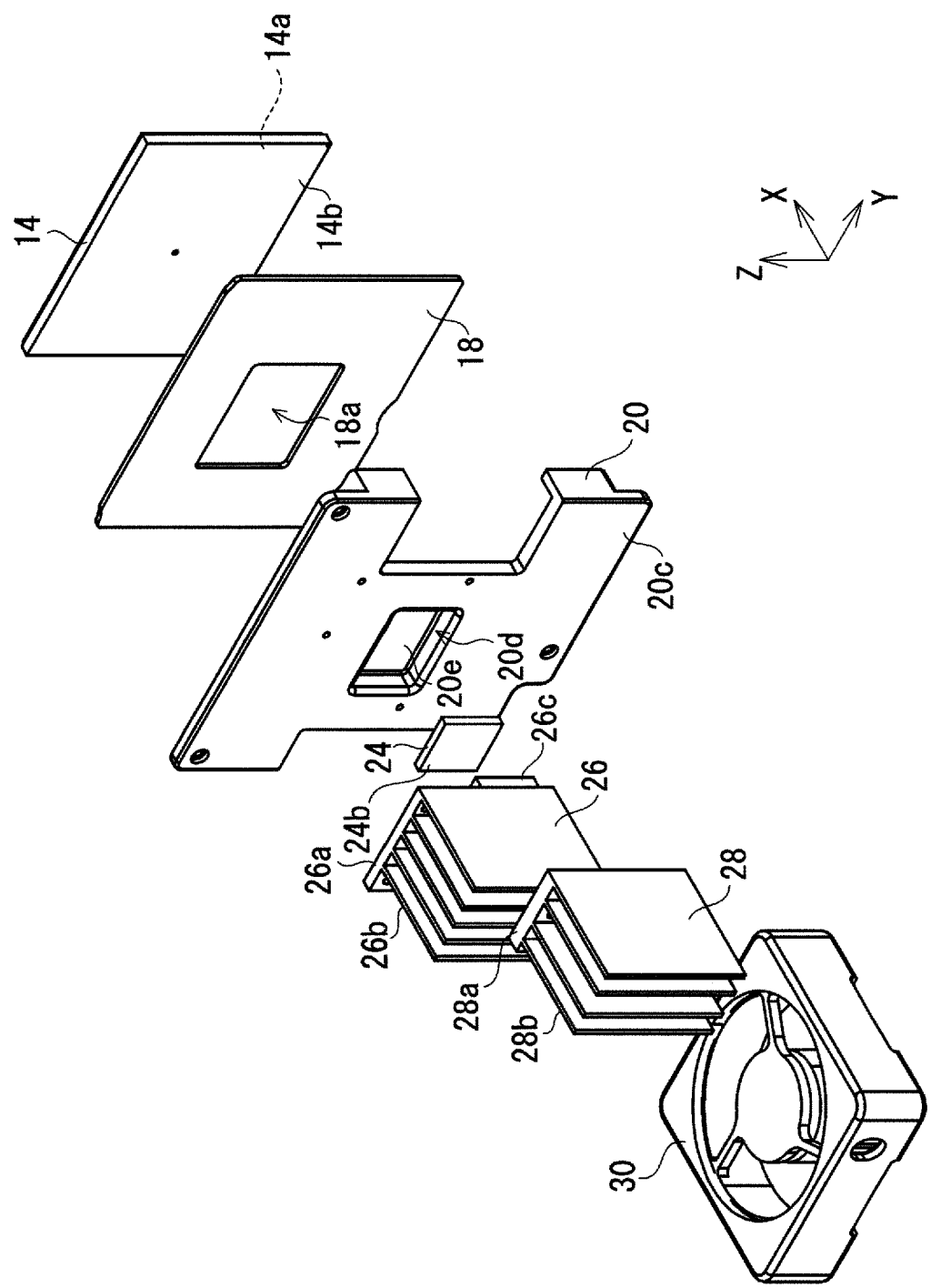
FIG. 3 is an exploded perspective view of the cooling system of the imaging element.
Figure 4:
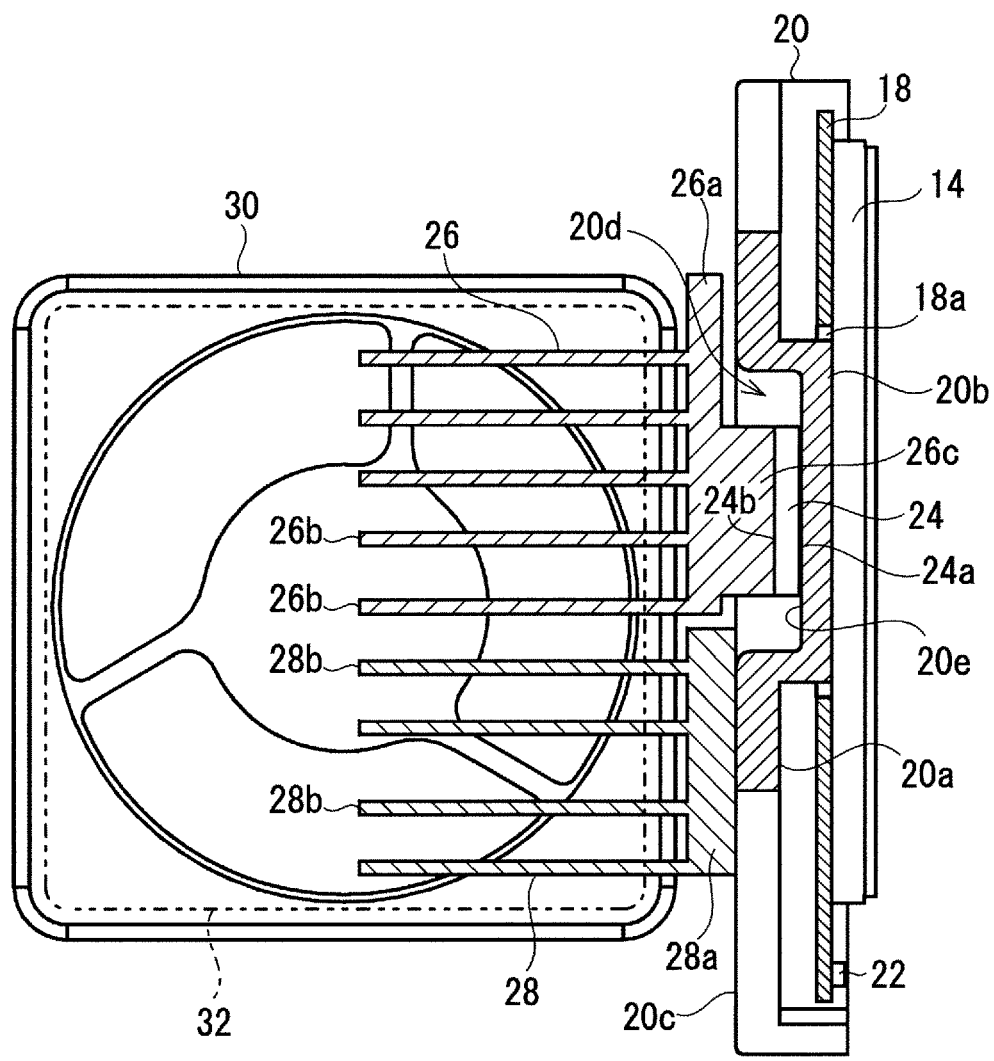
FIG. 4 is a cross-sectional view of the cooling system of the imaging element.

FIG. 1 is a perspective view of an imaging device according to an embodiment of the present disclosure. Further, FIG. 2 is a perspective view of a cooling system of an imaging element. Further, FIG. 3 is an exploded perspective view of the cooling system of the imaging element. FIG. 4 is a cross-sectional view of the cooling system of the imaging element.

The X-Y-Z orthogonal coordinate system shown in the figure is for facilitating the understanding of the present disclosure, and does not limit the present disclosure. The X-axis direction indicates the front-back direction of the imaging device, the Y-axis direction indicates the left-right direction of the imaging device, and the Z-axis direction indicates the height direction. Further, in the present specification, the side where a subject of the imaging device is present is referred to as a "front side", and the side where the imaging device is present is referred to as a "rear side".

As shown in FIG. 1, in the case of the present embodiment, an imaging device 10 has a casing 12 having a substantially cubic shape and an imaging element 14 arranged therein. The imaging element 14 is, for example, a CCD image sensor, a CMOS image sensor, or the like. An image of the subject is incident on a light receiving surface 14a of the imaging element 14 via a lens (not shown) attached to a lens mounting portion 16. The imaging element 14 outputs an electric signal corresponding to the incident image, that is, takes an image (captures a still image or a moving image).

As shown in FIGS. 2 to 4, the imaging device 10 also has a substrate 18 on which the imaging element 14 is mounted and a heat radiating plate 20 for cooling the imaging element 14.

As shown in FIG. 3, the imaging element 14 is mounted on the substrate 18 via a back surface 14b on the side opposite to the light receiving surface 14a. The substrate 18 is formed with, for example, a circuit that AD-converts an electric signal from the imaging element 14 and outputs the AD-converted electric signal to an image processing circuit. In the case of this embodiment, as shown in FIG. 4, a temperature sensor 22 for detecting the temperature of the substrate 18 is provided.

The heat radiating plate 20 is a member arranged in the casing 12, made of a material having high thermal conductivity, for example, a metal material such as aluminum or copper, and supporting the substrate 18. Further, the heat radiating plate 20 cools the imaging element 14 by absorbing heat from the imaging element 14 which becomes a high temperature state during shooting.

As shown in FIGS. 3 and 4, in the case of the present embodiment, the substrate 18 exists between the heat radiating plate 20 and the imaging element 14. Since the heat radiating plate 20 is in direct contact with the back surface 14b of the imaging element 14, the substrate 18 is formed at a position corresponding to the central portion of the back surface 14b of the imaging element 14, which can be the hottest, and includes a through hole 18a that penetrates in a thickness direction (X-axis direction). A convex portion 20b is formed on a front surface 20a of the heat radiating plate 20 so as to enter the through hole 18a of the substrate 18 to be in contact with the central portion of the back surface 14b of the imaging element 14. As a result, the heat radiating plate 20 can cool the imaging element 14 with a higher cooling efficiency than the case of indirectly cooling the imaging element 14 via the substrate 18.

In order to cool the heat radiating plate 20, as shown in FIGS. 3 and 4, the imaging device 10 further has a thermoelectric element 24, a first heat sink 26, and a second heat sink 28 inside the casing 12.

As shown in FIG. 4, the thermoelectric element 24 is, for example, a Peltier element including a heat absorbing surface 24a that is in contact with a heat generating source and absorbs heat of the heat generating source, and a heat radiating surface 24b that is a surface different from the heat absorbing surface 24a, is located on the opposite side of the heat absorbing surface 24a, and discharges the heat absorbed by the heat absorbing surface 24a. Upon receiving supply of electric power, the thermoelectric element 24 absorbs heat from the heat generating source via the heat absorbing surface 24a, and discharges the absorbed heat from the heat radiating surface 24b. Note that, in the case of the present embodiment, the heat generating source is the imaging element 14.

In the case of the present embodiment, as shown in FIG. 4, the thermoelectric element 24 comes into contact with a rear surface 20c of the heat radiating plate 20 via its heat absorbing surface 24a. Specifically, the heat absorbing surface 24a of the thermoelectric element 24 comes into contact with a bottom surface 20e of a concave portion 20d formed in the convex portion 20b. As a result, the thermoelectric element 24 faces the imaging element 14 with the convex portion 20b of the heat radiating plate 20 interposed between the imaging element 14 and the thermoelectric element 24. As a result, the heat absorbing surface 24a of the thermoelectric element 24 is thermally connected to the central portion of the back surface 14b of the imaging element 14, which can be the hottest, via the heat radiating plate 20 at the shortest distance. The term "thermally connected" as used herein refers to a state in which two objects are in direct or indirect contact with each other without passing through air and can transfer heat to each other. As a result, the thermoelectric element 24 can efficiently cool the central portion of the imaging element 14, which can be the hottest. A heat conductive tape or the like that promotes heat transfer between the thermoelectric element 24 and the heat radiating plate 20 may be provided between the heat absorbing surface 24a of the thermoelectric element 24 and the heat radiating plate 20.

As shown in FIG. 4, the first heat sink 26 is made of a material having high thermal conductivity, for example, a metal material such as aluminum or copper, and includes a base portion 26a and a plurality of fins 26b that extend from the base portion 26a in parallel to each other. In the case of the present embodiment, a convex portion 26c that comes into contact with the heat radiating surface 24b of the thermoelectric element 24 is provided on the surface of the base portion 26a on the side opposite to the surface on which the plurality of fins 26b are provided.

In the case of the present embodiment, as shown in FIG. 4, the first heat sink 26 is in contact with the heat radiating surface 24b of the thermoelectric element 24 arranged in the concave portion 20d of the heat radiating plate 20 via the convex portion 26c, As a result, the first heat sink 26 is thermally connected to the thermoelectric element 24. On the other hand, the first heat sink 26 is not thermally connected to the heat radiating plate 20. Specifically, in the case of the present embodiment, the base portion 26a of the first heat sink 26 is spaced apart from the rear surface 20c of the heat radiating plate 20, and is not in contact with the heat radiating plate 20. These reasons will be described later.

As shown in FIG. 4, the second heat sink 28 is made of a material having high thermal conductivity, for example, a metal material such as aluminum or copper, and includes a base portion 28a and a plurality of fins 28b that extend from the base portion 28a in parallel to each other.

Unlike the first heat sink 26, the second heat sink 28 is spaced apart from the thermoelectric element 24 and is not thermally connected. On the other hand, the second heat sink 28 is thermally connected to the heat radiating plate 20. Specifically, in the case of the present embodiment, the second heat sink 28 is thermally connected by contacting the rear surface 20c of the heat radiating plate 20. These reasons will be described later.

Further, in the case of the present embodiment, the first heat sink 26 and the second heat sink 28 are spaced apart from each other so that heat transfer does not substantially occur between them. The reason for this will be described later.

In the case of the present embodiment, as shown in FIG. 2, the imaging device 10 further includes a fan 30 inside the casing 12 for cooling both the first heat sink 26 and the second heat sink 28.

Figure 5:
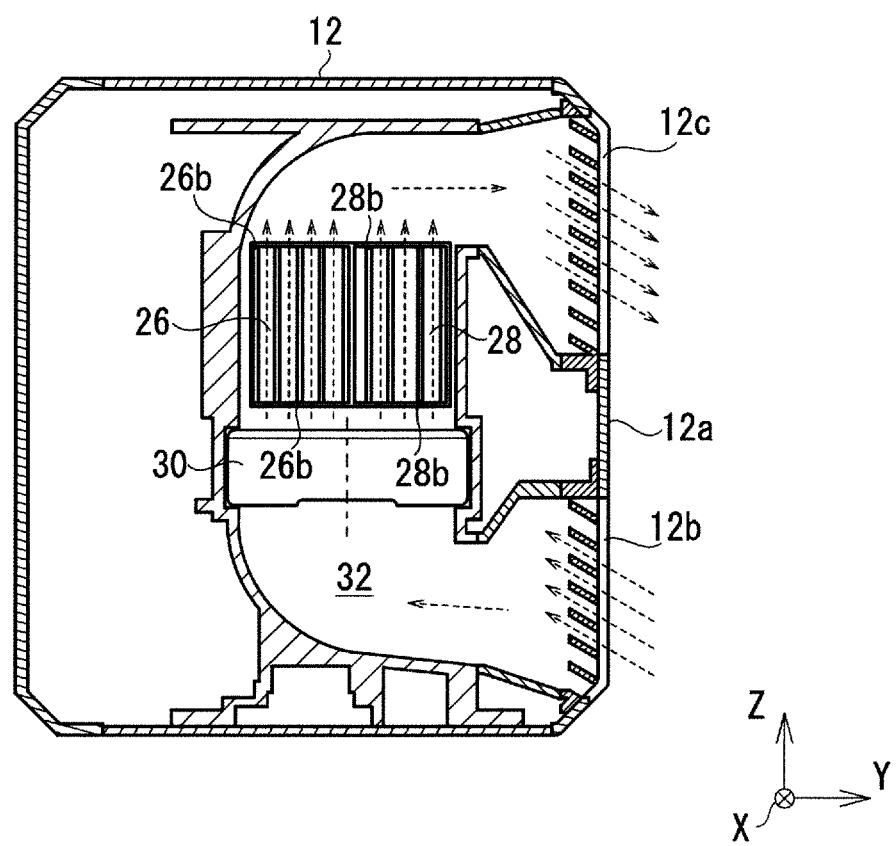
FIG. 5 is a cross-sectional view of an imaging device in which a duct is shown.

FIG. 5 is a cross-sectional view of an imaging device in which a duct is shown.

As shown in FIG. 5, in the case of the present embodiment, the fan 30 is arranged in the duct 32 formed in the casing 12. As shown in FIG. 1, the duct 32 extends inside the casing 12 so as to connect an intake port 12b and an exhaust port 12c formed on the right side surface 12a of the casing 12. As shown in FIG. 5, the fan 30 is provided in a straight line portion extending in the height direction (Z-axis direction) in the duct 32. As the fan 30 rotates, as shown by the broken line, air flows from the outside into the duct 32 through the intake port 12b, flows through the duct 32, and flows out through the exhaust port 12c.

As shown in FIGS. 4 and 5, the plurality of fins 26b of the first heat sink 26 and the plurality of fins 28b of the second heat sink 28 are arranged in the duct 32 so as to be located on the downstream side of the fan 30. As a result, the air blown by the fan 30 flows between the plurality of fins 26b of the first heat sink 26 and between the plurality of fins 28b of the second heat sink 28. As a result, the first heat sink 26 and the second heat sink 28 are cooled by the fan 30. Note that, in the case of the present embodiment, the plurality of fins 26b of the first heat sink 26 and the plurality of fins 28b of the second heat sink 28 are arranged equidistant from the fan 30, that is, are arranged in parallel with respect to the air flow direction in the duct 32. As a result, the first heat sink 26 and the second heat sink 28 are cooled to the same extent by the fan 30 (compared to the case where the first heat sink 26 and the second heat sink 28 are arranged in series in the air flow direction).

Up to this point, the configuration of the imaging device 10, particularly the configuration for cooling the imaging element 14, has been described. From here, the control of the imaging device 10 for cooling the imaging element 14 by using the fan 30 and the thermoelectric element 24 will be described.

Figure 6:
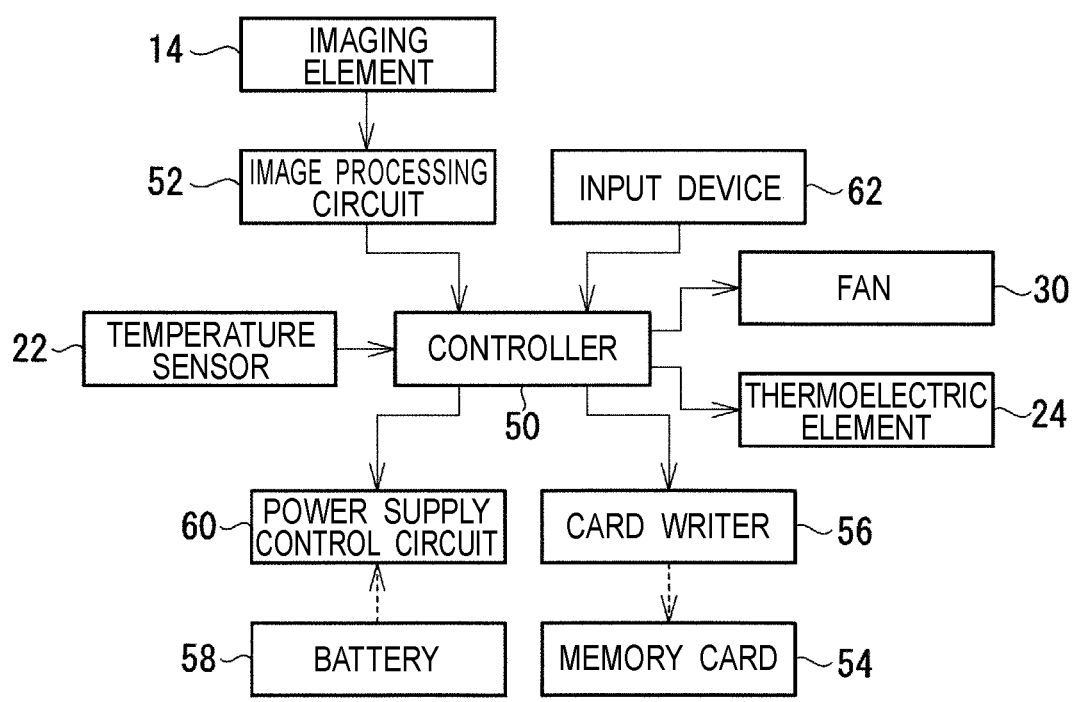
FIG. 6 is a block diagram of a control system of an imaging device that cools the imaging element.

FIG. 6 is a block diagram of a control system of an imaging device that cools an imaging element.

As shown in FIG. 6, the imaging device 10 includes a controller 50 that executes various controls including cooling control of the imaging element 14. The controller 50 includes, for example, a CPU and a storage device such as a ROM or RAM that stores a program for causing the CPU to execute various operations.

As an example, the controller 50 controls an image processing circuit 52 that processes an electric signal from the imaging element 14, that is, an image data of an image captured by the imaging element 14, and acquires the image-processed image from the image processing circuit 52. For example, the image processing circuit 52 is an image processing chip. Further, as an example, the controller 50 controls a card writer 56, which is a writing device for recording an image data acquired from the image processing circuit 52 on a memory card 54, which is a recording medium that can be attached to and detached from the imaging device 10. For example, the memory card 54 is a CFexpress card. Further, as an example, the controller 50 controls a power supply control circuit 60 that distributes the electric power of the battery 58 to the imaging element 14, the thermoelectric element 24, the fan 30, and the like. Furthermore, as an example, the controller 50 executes, for example, start and stop of moving image shooting, change of image processing conditions, and the like on the basis of user input via an input device 62 such as a plurality of buttons provided on the casing 12. Note that, the controller 50 also executes various controls on other components of the imaging device 10 (not shown in FIG. 6).

In the case of the present embodiment, the controller 50 selectively executes the first cooling mode and the second cooling mode as the control of the fan 30 and the thermoelectric element 24 for cooling the imaging element 14.

Figure 7:
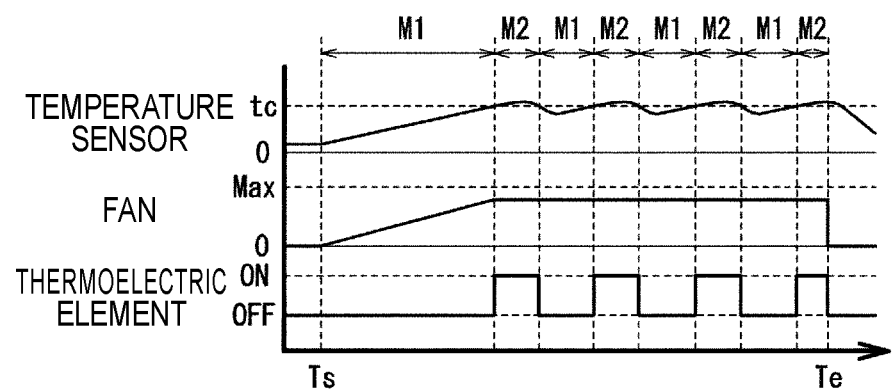
FIG. 7 is a diagram showing an example of a timing chart showing the operation timing of a fan and a thermoelectric element.

FIG. 7 shows an example of a timing chart showing the operation timings of the fan and the thermoelectric element.

As shown as an example in FIG. 7, when the imaging device 10 starts shooting (timing Ts), the temperature of the imaging element 14 starts to rise. Similarly, the temperature detected by the temperature sensor 22 starts to rise. That is, the temperature of the substrate 18 and the temperature of the heat radiating plate 20 that supports the substrate 18 start to rise. Note that, since there is a correlation between the temperature of the substrate 18 and the temperature of the heat radiating plate 20, in the case of the present embodiment, the temperature of the heat radiating plate 20 is indirectly detected from the temperature of the substrate 18 detected by the temperature sensor 22. Further, the reason why the temperature sensor 22 is not provided on the heat radiating plate 20 but is provided on the substrate 18 is that a circuit or the like for supplying electric power to the temperature sensor 22 is formed on the substrate 18.

In the case of the present embodiment, the controller 50 executes a first cooling mode M1 or a second cooling mode M2 on the basis of the temperature detected by the temperature sensor 22 while the imaging device 10 is shooting, for example, during moving image shooting, that is, while the imaging element 14 continues to generate heat.

As shown in FIG. 7, the first cooling mode M1 is a control mode in which the controller 50 operates only the fan 30 to cool the heat radiating plate 20. During execution of the first cooling mode M1, the controller 50 maintains the thermoelectric element 24 in an unpowered OFF state. During execution of the first cooling mode M1, the rotation speed of the fan 30 may change based on the change in the temperature detected by the temperature sensor 22, or may be maintained at a predetermined constant rotation speed (for example, such a rotation speed that the microphone of the imaging device 10 does not pick up rotation sound of the fan 30).

During execution of the first cooling mode M1, almost all of the heat generated from the imaging element 14 is transferred to the second heat sink 28 via the heat radiating plate 20. That is, the imaging element 14 is cooled by the second heat sink 28. Further, in the case of the present embodiment, the second heat sink 28 to which heat is transferred is cooled by the fan 30. Note that, a small part of the heat is transferred from the heat radiating plate 20 to the first heat sink 26 via the stopped thermoelectric element 24.

As the shooting of the imaging device 10 further continues, the temperature of the imaging element 14 further rises, and thereby the temperature detected by the temperature sensor 22 also further rises. When the temperature detected by the temperature sensor 22 reaches a predetermined temperature tc, the controller 50 switches from the first cooling mode M1 to the second cooling mode M2. The predetermined temperature tc is determined based on the temperature range in which the imaging element 14 can normally operate.

As shown in FIG. 7, when the first cooling mode M1 is switched to the second cooling mode M2, the controller 50 supplies electric power to operate (turn on) the thermoelectric element 24. Further, the controller 50 maintains the fan 30 in a rotating state. Note that, during execution of the second cooling mode M2, the rotation speed of the fan 30 may change based on the change in the temperature detected by the temperature sensor 22, or may be maintained at a predetermined constant rotation speed.

During execution of the second cooling mode M2, a part of the heat generated from the imaging element 14 is transferred from the heat radiating plate 20 to the first heat sink 26 by the thermoelectric element 24 in the ON state. That is, the imaging element 14 is cooled by the combination of the thermoelectric element 24 and the first heat sink 26. Further, the remaining heat is transferred to the second heat sink 28 via the heat radiating plate 20. That is, the imaging element 14 is cooled by the second heat sink 28. The first heat sink 26 and the second heat sink 28 to which heat is transferred are cooled by the fan 30. By performing such cooling using the thermoelectric element 24 and cooling without the thermoelectric element 24 in combination, the temperature detected by the temperature sensor 22 decreases, that is, the temperature of the imaging element 14 decreases. Thus, the thermoelectric element 24 has a sufficient cooling capacity capable of decreasing the temperature of the imaging element 14 in cooperation with the fan 30.

As shown in FIG. 4, the first heat sink 26 is spaced apart from the heat radiating plate 20, that is, the space between the first heat sink 26 and the heat radiating plate 20 is thermally insulated by an air layer. This is because it suppresses that a part of the heat transferred from the thermoelectric element 24 to the first heat sink 26 during execution of the second cooling mode M2 returns to the heat radiating plate 20 if the first heat sink 26 and the heat radiating plate 20 are in contact with each other. Otherwise, a thermal loop is generated in which heat is repeatedly transferred to the heat radiating plate 20, the thermoelectric element 24, the first heat sink 26, and the heat radiating plate 20 in sequence, and the cooling efficiency of the second cooling mode M2 is lowered. Also, during execution of the first cooling mode M1, the first heat sink 26 continues to be cooled by the fan 30. As a result, the first heat sink 26 is in a state of substantially not holding heat because heat is not transferred from the thermoelectric element 24 in the OFF state. Therefore, when the thermoelectric element 24 shifts to the ON state, the first heat sink 26 can quickly absorb the heat held by the heat radiating plate 20. As a result, the temperature of the imaging element 14 can be quickly lowered.

Further, in the case of the present embodiment, as shown in FIG. 4, the first heat sink 26 and the second heat sink 28 are spaced apart from each other, that is, the space between the first heat sink 26 and the second heat sink 28 is thermally insulated by an air layer. This is because it suppresses that a part of the heat transferred from the thermoelectric element 24 to the first heat sink 26 during execution of the second cooling mode M2 returns to the heat radiating plate 20 via the second heat sink 28 if the first heat sink 26 and the second heat sink 28 are in contact with each other. Otherwise, a thermal loop is generated in which heat is repeatedly transferred to the heat radiating plate 20, the thermoelectric element 24, the first heat sink 26, the second heat sink 28, and the heat radiating plate 20 in sequence, and the cooling efficiency of the second cooling mode M2 is lowered.

Alternatively, if the cooling by the thermoelectric element 24 in the second cooling mode M2 causes the temperature of the imaging element 14 to decrease in an acceptable time, that is, if the effect of the thermal loop described above is small, then the first heat sink 26 and the second heat sink 28 may be in contact with each other so that heat transfer is possible. As a result, the first heat sink 26 can be used for cooling the heat radiating plate 20 during execution of the first cooling mode M1.

As shown in FIG. 7, the execution of the second cooling mode M2 decreases the temperature of the imaging element 14, thereby decreasing the temperature detected by the temperature sensor 22. When the temperature detected by the temperature sensor 22 returns to the predetermined temperature tc, the controller 50 switches from the second cooling mode M2 to the first cooling mode M1, that is, shifts the thermoelectric element 24 to the OFF state.

By alternately repeating the first cooling mode M1 and the second cooling mode M2, the temperature of the imaging element 14 can be maintained constant. Specifically, the temperature of the imaging element 14 can be maintained constant without maintaining the ON state of the thermoelectric element 24. As a result, the imaging element 14 can be cooled while suppressing the power consumption of the thermoelectric element 24, that is, without continuously supplying the electric power to the thermoelectric element 24.

As shown in FIG. 7, when the shooting of the imaging device 10 is completed (timing Te), the controller 50 stops the fan 30 and shifts the thermoelectric element 24 to the OFF state if it is in the ON state. The fan 30 may rotate from the end timing of shooting until a predetermined time elapses.

According to such an embodiment, the imaging element 14 which is a heat generating source can be cooled while suppressing power consumption.

Although the embodiment of the present disclosure has been described above with reference to the above-described embodiment, the embodiments of the present disclosure are not limited to the above-described embodiment.

In the case of the above embodiment, as shown in FIG. 5, the first heat sink 26 and the second heat sink 28 are cooled by a common fan 30. However, the embodiments of the present disclosure are not limited to this. For example, one part of at least one of the first heat sink 26 and the second heat sink 28 may be cooled by the outside air by being exposed to the outside of the casing 12.

Further, in the case of the above-described embodiment, as shown in FIG. 7, the thermoelectric element 24 is controlled based on the temperature detected by the temperature sensor 22. However, the embodiments of the present disclosure are not limited to this. For example, the thermoelectric element 24 may be controlled based on the elapsed time from the start of moving image shooting, the outside air temperature, and the like.

Further, in the case of the above-described embodiment, the imaging element 14 is cooled by the thermoelectric element 24, the first heat sink 26, and the second heat sink 28. However, the embodiments of the present disclosure are not limited to this. As shown in FIG. 6, the heat generating source to be cooled may be an imaging element 14, an image processing circuit 52 (image processing chip) that processes an image data of an image captured by the imaging element 14, or a card writer 56 that records on the memory card 54 an image data processed by the image processing circuit 52. Alternatively, each of at least two of these may be provided with a thermoelectric element, a first heat sink, and a second heat sink.

That is, in a broad sense, the imaging device according to the embodiment of the present disclosure includes a heat generating source, a heat radiating plate that cools the heat radiating source, a thermoelectric element including a heat absorbing surface in contact with the heat radiating plate and a heat radiating surface different from the heat absorbing surface, and receiving supply of electric power to discharge the heat absorbed by the heat absorbing surface from the heat radiating surface, a first heat sink that is in contact with the heat radiating surface of the thermoelectric element and is spaced apart from the heat radiating plate, and a second heat sink that is in contact with the heat radiating plate.

As described above, the embodiment has been described as an example of the technology in the present disclosure. For this purpose, the drawings and detailed description are provided. Accordingly, among the components described in the drawings and the detailed description, not only the components essential for solving the problem, but also the components not essential for solving the problem may also be included in order to exemplify the above technology. Therefore, it should not be immediately recognized that these non-essential components are essential as those non-essential components are described in the drawings and detailed description.

Moreover, since the above-mentioned embodiment is for demonstrating the technology in the present disclosure, various changes, substitutions, additions, omissions, etc. can be performed in a claim or its equivalent range.

The present disclosure is applicable to imaging devices that require cooling.

What is claimed is:

1. An imaging device comprising:
   a heat generating source;
   a heat radiating plate that cools the heat generating source;

a thermoelectric element that includes a heat absorbing surface in contact with the heat radiating plate and a heat radiating surface different from the heat absorbing surface, and receives supply of electric power to discharge heat absorbed by the heat absorbing surface from the heat radiating surface;

a first heat sink that is in contact with the heat radiating surface of the thermoelectric element and is spaced apart from the heat radiating plate;

a second heat sink that is in contact with the heat radiating plate; and a substrate on which the heat generating source is mounted, wherein the substrate includes a through hole, and the heat radiating plate includes, on a surface facing the substrate, a convex portion that enters the through hole of the substrate to be in contact with the heat generating source.

2. The imaging device according to claim 1, wherein the thermoelectric element is in contact with the heat radiating plate so as to face the heat generating source with the convex portion of the heat radiating plate interposed between the heat generating source and the thermoelectric element.

3. An imaging device comprising:

a heat generating source;

a heat radiating plate that cools the heat generating source;

a thermoelectric element that includes a heat absorbing surface in contact with the heat radiating plate and a heat radiating surface different from the heat absorbing surface, and receives supply of electric power to discharge heat absorbed by the heat absorbing surface from the heat radiating surface;

a first heat sink that is in contact with the heat radiating surface of the thermoelectric element and is spaced apart from the heat radiating plate;

a second heat sink that is in contact with the heat radiating plate;

a fan that cools both the first heat sink and the second heat sink; and a controller that controls the thermoelectric element and the fan, wherein the controller selectively executes a first cooling mode for operating the fan and a second cooling mode for operating both the fan and the thermoelectric element.

4. The imaging device according to claim 3, further comprising a temperature sensor that detects a temperature of the heat radiating plate, wherein the controller executes the first cooling mode when a temperature detected by the temperature sensor is lower than a predetermined temperature, and executes the second cooling mode when a temperature detected by the temperature sensor is higher than a predetermined temperature.

* * * * *